United States Patent
Patil

(10) Patent No.: US 6,709,805 B1
(45) Date of Patent: Mar. 23, 2004

(54) INKJET PRINTHEAD NOZZLE PLATE

(75) Inventor: Girish S. Patil, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 10/422,477

(22) Filed: Apr. 24, 2003

(51) Int. Cl.[7] .............................. G03F 7/00; B41J 2/16
(52) U.S. Cl. ...................................... 430/320; 430/330
(58) Field of Search ................................ 430/320, 330; 347/47

(56) References Cited

U.S. PATENT DOCUMENTS

| | | |
|---|---|---|
| 5,198,834 A | 3/1993 | Childers et al. |
| 5,334,999 A * | 8/1994 | Kashiwazaki et al. .......... 347/65 |
| 5,458,254 A | 10/1995 | Miyagawa et al. |
| 5,478,606 A | 12/1995 | Ohkuma et al. |
| 5,686,224 A | 11/1997 | O'Neill |
| 5,760,803 A | 6/1998 | Yamamoto et al. |
| 5,945,260 A | 8/1999 | Miyagawa et al. |
| 6,109,728 A | 8/2000 | Kakuda et al. |
| 6,139,761 A | 10/2000 | Ohkuma |
| 6,162,589 A | 12/2000 | Chen et al. |
| 6,164,762 A | 12/2000 | Sullivan et al. |
| 6,193,359 B1 | 2/2001 | Patil et al. |
| 6,310,641 B1 | 10/2001 | Mrvos et al. |
| 2001/0015739 A1 | 8/2001 | Usui et al. |

FOREIGN PATENT DOCUMENTS

| | | |
|---|---|---|
| EP | 0 814 380 A2 | 12/1997 |
| EP | 0 953 445 A2 | 11/1999 |
| EP | 1 016 525 A2 | 7/2000 |
| JP | 63-126756 A * | 5/1988 |
| JP | 08258275 A | 10/1996 |
| JP | 09300627 A | 11/1997 |
| JP | 11-314371 | 11/1999 |

* cited by examiner

Primary Examiner—John A. McPherson
(74) Attorney, Agent, or Firm—Michael T. Sanderson, Esq.; King & Schickli, PLLC

(57) ABSTRACT

Methods of forming a nozzle plate for a substrate with an ink ejection element include forming first and second negative photoresist layers, each with a different degradation temperature, directly on the substrate in accordance with a desired nozzle plate pattern. Upon heating the layers at a temperature greater than or at least as great as one of degradation temperatures and lower than the other, the negative photoresist layer with the lower degradation temperature breaks down while the other negative photoresist layer suffers nothing and remains intact. Thereafter, the degraded negative photoresist is completely removed with a simple solvent development step and the nozzle plate is formed. Preferred arrangements of negative photoresist materials include a first layer located adjacent the ink ejection element and a second layer on both the substrate and the first layer at locations other than above the ink ejection element.

20 Claims, 5 Drawing Sheets

ID OF THE INVENTION

The present invention relates to inkjet printheads. In particular, it relates to a nozzle plate thereof formed with at least two negative acting photoresist layers, each with a different temperature of degradation, such that heating of the layers results in degradation of one layer, but not the other, so that the degraded layer can be removed and the nozzle plate formed.

BACKGROUND OF THE INVENTION

The art of inkjet printing is relatively well known. In general, an image is produced by emitting ink drops from a printhead at precise moments such that they impact a print medium at a desired location. The printhead is supported by a movable print carriage within a device, such as an inkjet printer, and is caused to reciprocate relative to an advancing print medium and emit ink drops at times pursuant to commands of a microprocessor or other controller. The timing of the ink drop emissions corresponds to a pattern of pixels of the image being printed. Other than printers, familiar devices incorporating inkjet technology include fax machines, all-in-ones, photo printers, and graphics plotters, to name a few.

A conventional thermal inkjet printhead includes access to a local or remote supply of color or mono ink, a heater chip, a nozzle or orifice plate attached or formed with the heater chip, and an input/output connector, such as a tape automated bond (TAB) circuit, for electrically connecting the heater chip to the printer during use. The heater chip, in turn, typically includes a plurality of thin film resistors or heater elements fabricated by deposition, masking and etching techniques on a substrate such as silicon.

To print or emit a single drop of ink, an individual heater is uniquely addressed with a predetermined amount of current to rapidly heat a small volume of ink. This causes the ink to vaporize in a local bubble chamber (between the heater and nozzle plate) and be ejected through the nozzle plate towards the print medium.

Typically, nozzle plates that attach to the heater chip, post-chip-formation, have certain economic and mechanical drawbacks relating to the alignment between the nozzle plate orifices and the heater elements. As is known, poor alignment causes product defects or ineffectiveness. On the other hand, nozzle plates concurrently formed with the heater chip often suffer deformations in ink flow features or nozzle orifice shapes upon subsequent chip processing steps. Again, product defects or ineffectiveness can result.

Accordingly, a need exists in the nozzle plate art for economic and simple designs that overcome misalignment and malformation.

SUMMARY OF THE INVENTION

The above-mentioned and other problems become solved by applying the principles and teachings associated with the hereinafter described inkjet printhead having a nozzle plate formed with at least two negative acting photoresist layers.

In one embodiment, the invention teaches a nozzle plate for a substrate made by forming first and second negative photoresist layers, each with a different degradation temperature, directly on the substrate in accordance with a desired nozzle plate pattern. With the first negative photoresist layer having a first degradation temperature lower than the second layer, upon heating the layers at a temperature higher than or at least as high as the first degradation temperature, the first negative photoresist layer suffers molecular break down. Meanwhile, if the heating temperature is below the degradation temperature of the second negative photoresist layer, the second layer remains unaffected. The degraded first negative photoresist is removed by development with a solution and the nozzle plate is finished. Preferred arrangements of negative photoresist include a first layer located adjacent the ink ejection element and a second layer on both the substrate and the first layer at locations other than above the ink ejection element.

In other aspects of the invention, the layers become formed by spin casting a solution or laminating dry films of negative photoresist material directly on a surface of a substrate containing ink ejection elements. Exposure of the layers to ultraviolet or other high energy sources during photomasking operations leads to cross-linking of the layers in specific patterns consistent with a pattern of the photomask.

Inkjet printers for housing the printheads are also disclosed.

These and other embodiments, aspects, advantages, and features of the present invention will be set forth in the description which follows, and in part will become apparent to those of ordinary skill in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

In the following detailed description of the preferred embodiments, reference is made to the accompanying drawings that form a part hereof, and in which is shown by way of illustration, specific embodiments in which the inventions may be practiced. These embodiments are described in sufficient detail to enable those skilled in the art to practice the invention, and it is to be understood that other embodiments may be utilized and that process or other changes may be made without departing from the scope of the present invention. The following detailed description is, therefore, not to be taken in a limiting sense and the scope of the present invention is defined only by the appended claims and their equivalents. In accordance with the present invention, an inkjet printhead having a nozzle plate formed of two negative photoresist layers each having a different temperature of degradation is hereinafter described.

Figure 1:
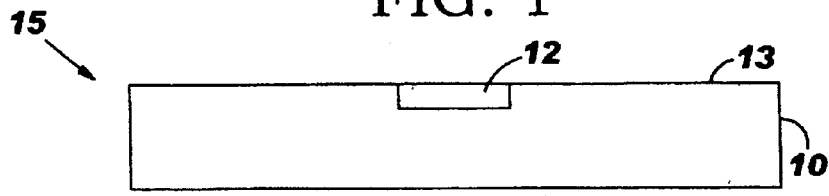
FIG. 1 is a diagrammatic cross-section view in accordance with the teachings of the present invention of an inkjet printhead wafer with an ink ejection element.
Figure 3:
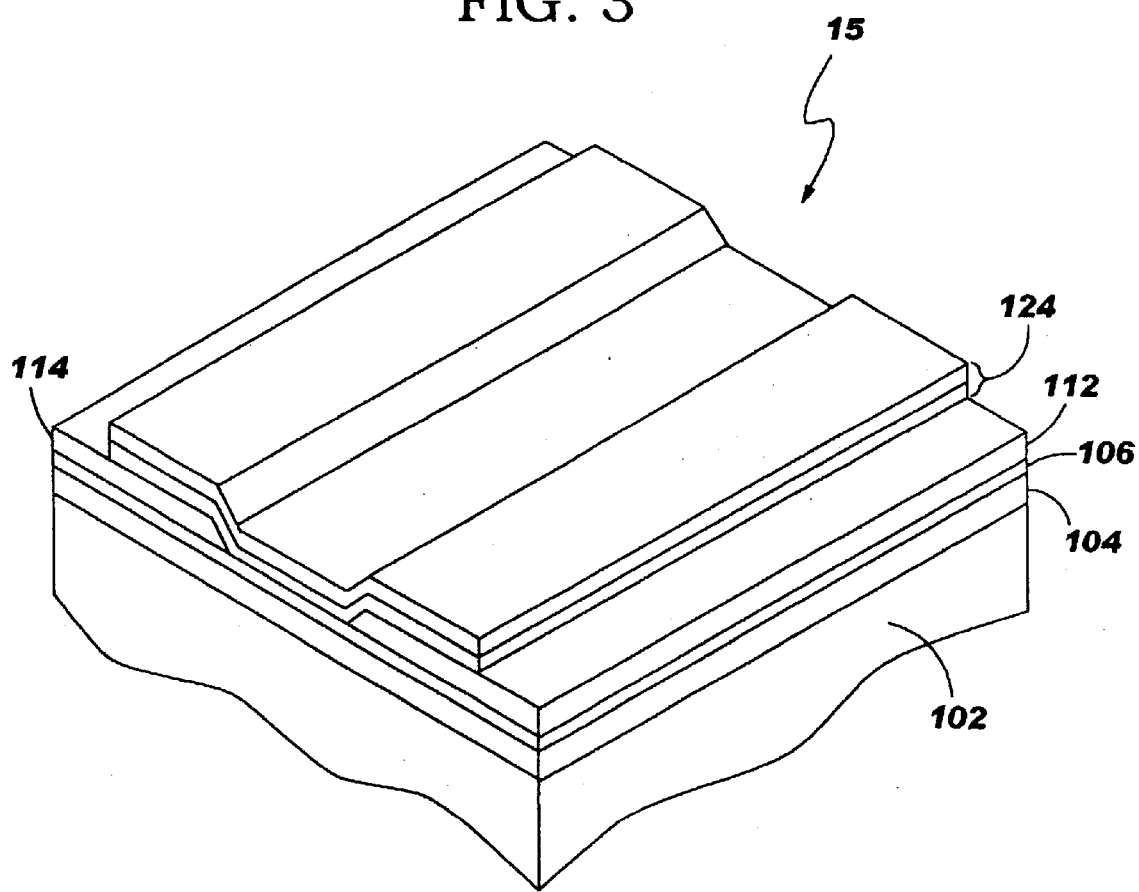
FIG. 3 is a perspective view in accordance with the teachings of the present invention of a heater chip.

With reference to FIG. 3, and appreciating that an individual ink ejection element is one of many ink ejection elements on a heater chip, skilled artisans know the economy of scale achieved by fabricating ink ejection elements as thin film layers on a wafer or a substrate through a series of growth layers, deposition layers, masking, patterning, photolithography, and/or etching or other processing steps. In general, the thin film layers of a heater chip 15 include, but are not limited to: a base substrate 102 (including any base semiconductor structure such as silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures known or hereinafter developed); a thermal barrier layer 104 on the substrate; a heater or resistor layer 106 on the thermal barrier layer; a conductor layer (bifurcated into positive 112 and negative 114 electrode sections, i.e., anodes and cathodes) on the resistor layer to heat the resistor layer through thermal conductivity during use; passivation layer(s) 124, such as SiC and/or SiN; and an overlying cavitation layer (not shown) on the passivation layer(s). By incorporation by reference, co-pending application Ser. No. 10/146,578, entitled "Heater Chip Configuration for an inkjet Printhead and Printer," filed May 14, 2002 and having common assignee teaches suitable layers, thicknesses, compositions and stable ink jetting energy ranges relevant to the instant invention. For simplicity, FIG. 1 shows the heater chip 15 of the invention generically as a wafer or substrate 10 containing at least one ink ejection element 12 for ejecting ink from an attendant inkjet printhead during use.

As is known, various methods for processing the thin film layers include, but are not limited to, any variety of chemical vapor depositions (CVD), physical vapor depositions (PVD), epitaxy, ion beam deposition, evaporation, sputtering or other similarly known techniques. Preferred CVD techniques include low pressure (LP), atmospheric pressure (AP), plasma enhanced (PE), high density plasma (HDP) or other. Preferred etching techniques include, but are not limited to, any variety of wet or dry etches, reactive ion etches, deep reactive ion etches, etc. Preferred photolithography steps include, but are not limited to, exposure to ultraviolet or x-ray light sources, or other known or hereinafter developed technologies.

In still other embodiments, the substrate itself comprises a silicon wafer of p-type, 100 orientation, having a resistivity of 5–20 ohm/cm. Its beginning thickness is preferably, but not necessarily required, any one of 525+/−20 microns, 625+/−20 microns, or 625+/−15 microns with respective wafer diameters of 100+/−0.50 mm, 125+/−0.50 mm, and 150+/−0.50 mm.

The thermal barrier layer overlying the substrate includes a silicon oxide layer mixed with a glass such as BPSG, PSG or PSOG with an exemplary thickness of about 0.5 to about 3 microns, especially 1.82+/−0.15 microns. This layer can be deposited or grown according to manufacturing preference.

The heater element layer on the thermal barrier layer is about a 50–50% tantalum-aluminum composition layer of about 900 or 1000 angstroms thick. In other embodiments, the resistor layer includes essentially pure or composition layers of any of the following: hafnium, Hf, tantalum, Ta, titanium, Ti, tungsten, W, hafnium-diboride, $HfB_2$, Tantalum-nitride, $Ta_2N$, TaAl (N,O), TaAlSi, TASiC, Ta/TaAl layered resistor, Ti(N,O), WSi(O) and the like.

The conductor layer overlying portions of the heater layer includes an anode and a cathode with about a 99.5–0.5% aluminum-copper composition of about 5000+/−10% angstroms thick. In other embodiments, the conductor layer includes pure aluminum or diluted compositions of aluminum with 2% copper or aluminum with 4% copper.

Figure 4:
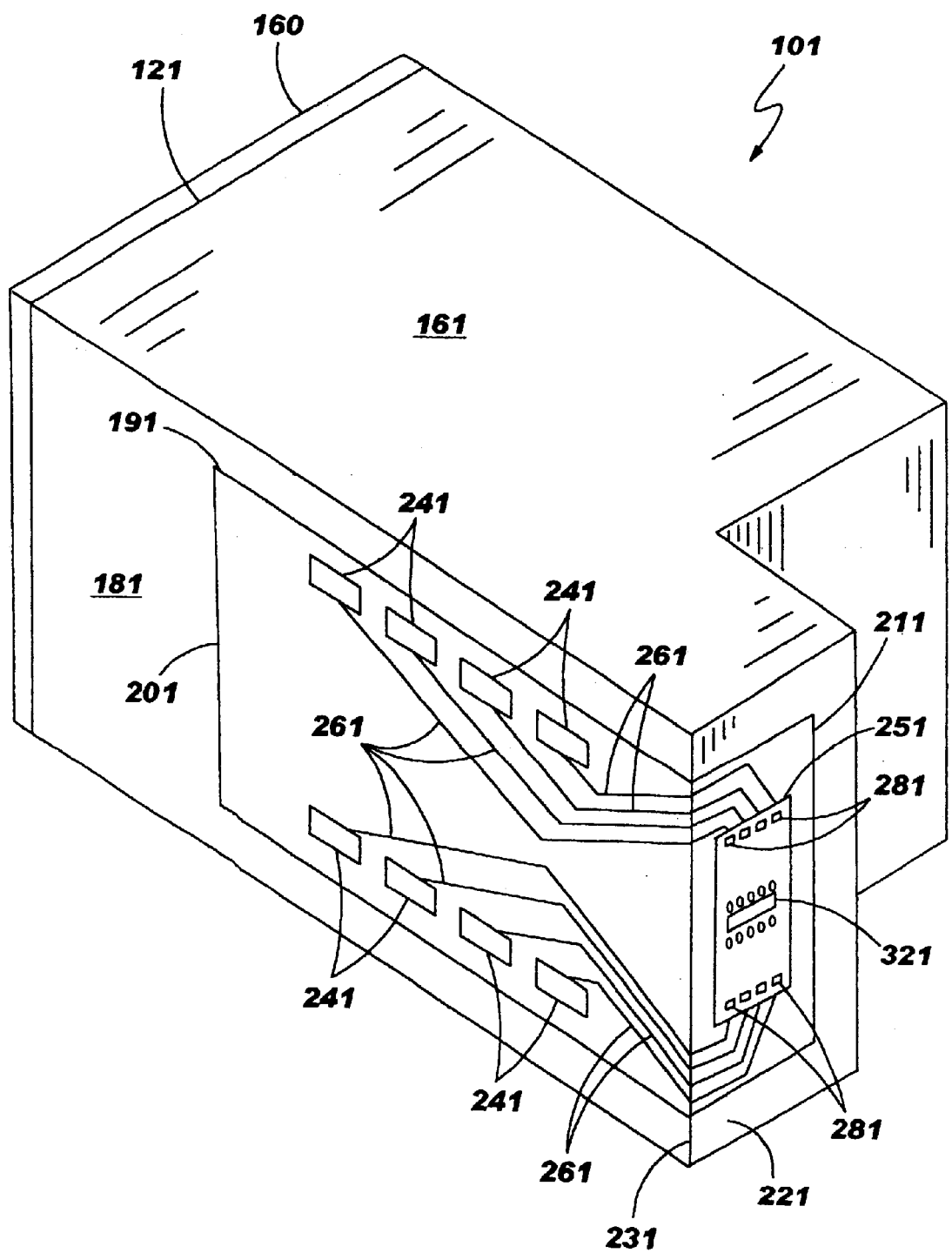
FIG. 4 is a perspective view of an inkjet printhead with a heater chip having a nozzle plate formed in accordance with the teachings of the present invention.

With reference to FIG. 4, an inkjet printhead of the present invention for housing the heater chip is shown generally as 101. The printhead 101 has a housing 121 formed of a body 161 and a lid 160. Although shown generally as a rectangular solid, the housing shape varies and depends upon the external device that carries or contains the printhead. The housing has at least one compartment, internal thereto, for holding an initial or refillable supply of ink and a structure, such as a foam insert, lung or other, maintains an appropriate backpressure therein during use. In another embodiment, the internal compartment includes three chambers for containing three supplies of ink, especially cyan, magenta and yellow ink. In other embodiments, the compartment may contain black ink, photo-ink and/or plurals of cyan, magenta or yellow ink. It will be appreciated that fluid connections (not shown) may exist to connect the compartment(s) to a remote source of ink.

A portion 191 of a tape automated bond (TAB) circuit 201 adheres to one surface 181 of the housing while another portion 211 adheres to another surface 221. As shown, the two surfaces 181, 221 exist substantially perpendicularly to one another about an edge 231.

The TAB circuit 201 has a plurality of input/output (I/O) connectors 241 fabricated thereon for electrically connecting a heater chip 251 to an external device, such as a printer, fax machine, copier, photo-printer, plotter, all-in-one, etc., during use. Pluralities of electrical conductors 261 exist on the TAB circuit 201 to electrically connect and short the I/O connectors 241 to the bond pads 281 of the heater chip 251 and various manufacturing techniques are known for facilitating such connections. Skilled artisans should appreciate that while eight I/O connectors 241, eight electrical conductors 261 and eight bond pads 281 are shown, any number are possible and the invention embraces all variations. The invention also embraces embodiments where the number of connectors, conductors and bond pads do not equal one another.

The heater chip 251 contains at least one ink via 321 that fluidly connects the heater chip to a supply of ink internal to the housing. During printhead manufacture, the heater chip 251 preferably attaches to the housing with any of a variety of adhesives, epoxies, etc. well known in the art. As shown, the heater chip contains two columns of ink ejection elements on either side of via 321. For simplicity in this crowded figure, dots or small circles depict the ink ejection elements in the columns. In an actual printhead, hundreds or thousands of ink ejection elements may be found on the printhead and may have various vertical and horizontal alignments, offsets or other. A nozzle plate, to be described below, is formed over and concurrently with the heater chip such that the nozzle orifices align with the heaters.

Figure 5:
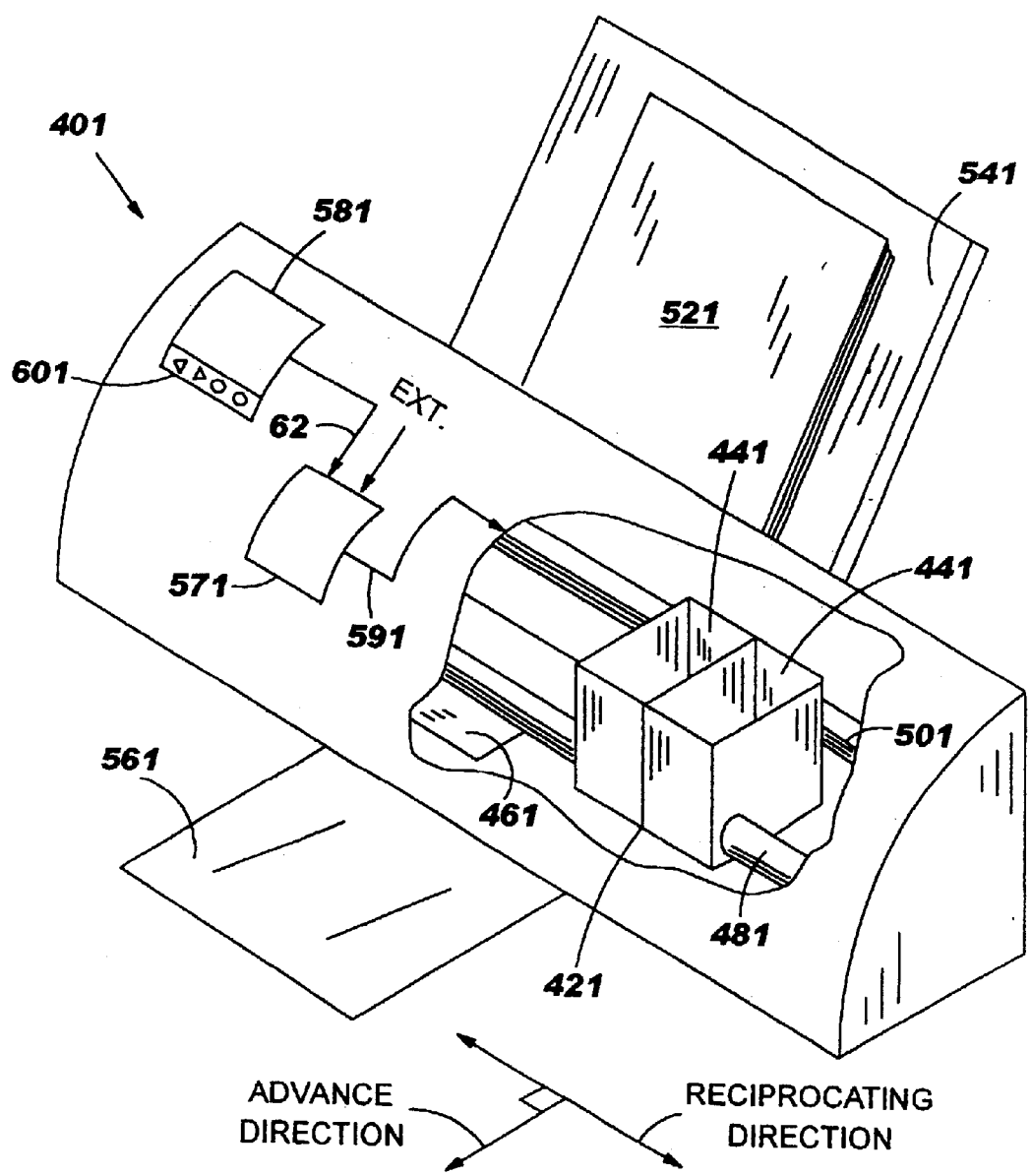
FIG. 5 is a perspective view of an inkjet printer for housing an inkjet printhead with a heater chip and nozzle plate formed in accordance with the teachings of the present invention.

With reference to FIG. 5, an external device in the form of an inkjet printer contains the printhead 101 and is shown generally as 401. The printer 401 includes a carriage 421 having a plurality of slots 441 for containing one or more printheads. The carriage 421 is caused to reciprocate (via an output 591 of a controller 571) along a shaft 481 above a print zone 461 by a motive force supplied to a drive belt 501 as is well known in the art. The reciprocation of the carriage 421 is performed relative to a print medium, such as a sheet of paper 521, that is advanced in the printer 401 along a paper path from an input tray 541, through the print zone 461, to an output tray 561.

In the print zone, the carriage 421 reciprocates in the Reciprocating Direction generally perpendicularly to the paper Advance Direction as shown by the arrows. Ink drops from the printheads (FIG. 4) are caused to be ejected from the heater chip at such times pursuant to commands of a printer microprocessor or other controller 571. The timing of the ink drop emissions corresponds to a pattern of pixels of the image being printed. Often times, such patterns are generated in devices electrically connected to the controller (via Ext. input) that are external to the printer such as a computer, a scanner, a camera, a visual display unit, a personal data assistant, or other.

To print or emit a single drop of ink, an ink ejection element is uniquely addressed with a short pulse of current to rapidly heat a small volume of ink. This vaporizes a thin layer of the ink on the ink ejection element surface; the resulting vapor bubble expels a column of ink out of the orifice and towards the print medium. Alternatively, tile ink ejection elements may include piezoelectric features, such as a flexing diaphragm, that emit ink drops by converting an electrical firing signal into a mechanical deflection of the diaphragm.

A control panel 581 having user selection interface 601 may also provide input 621 to the controller 571 to enable additional printer capabilities and robustness.

With reference to FIGS. 2A–2G, a substrate 10 with an ink ejection element 12 has formed thereon a first negative photoresist layer 14, especially an epoxy photoresist. Preferably, but not required, the layer 14 becomes formed by either spin casting a solution or laminating a dry film of the negative photoresist material on a surface 13 (FIG. 1) of the substrate to a uniform thickness or depth of about 14 to about 16 microns. The process conditions under which this layer becomes formed includes spin casting between 2000 and 4000 r.p.m. followed by baking in a temperature range of about 60° C. to 90° C. Skilled artisans should appreciate that the foregoing materials, process conditions and thicknesses are merely a function of user preference and should not be used to limit the claim unless such limitations are found in the claim.

Once formed, a photomask 16 having light passing regions 18 and non-light passing regions 20 is introduced between an energy source 22 and the substrate to expose portion(s) of the first negative photoresist layer to energy rays (arrows 24) in accordance with the pattern of the photomask. Preferably, the energy rays from the energy source impinge an area 26 adjacent the ink ejection element 12 to render the area insoluble (e.g., cross-linked) while areas 28 well beyond the periphery of the ink ejection element remain unexposed. In one embodiment, the energy source is an ultraviolet (UV) source operating at 1-line frequencies for a period of about 3–20 seconds. In other embodiments, the energy source comprises deep UV radiation, electron rays, X-rays or other.

Figure 2A:
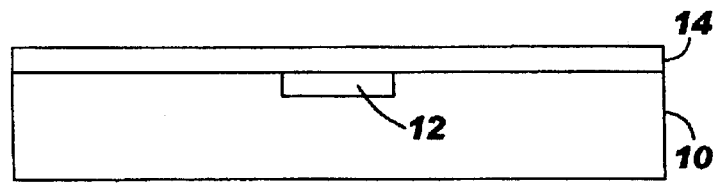
FIG. 2A is a diagrammatic cross-section view in accordance with the teachings of the present invention of an inkjet printhead wafer with a first negative photoresist layer in a processing step subsequent to FIG. 1.
Figure 2B:
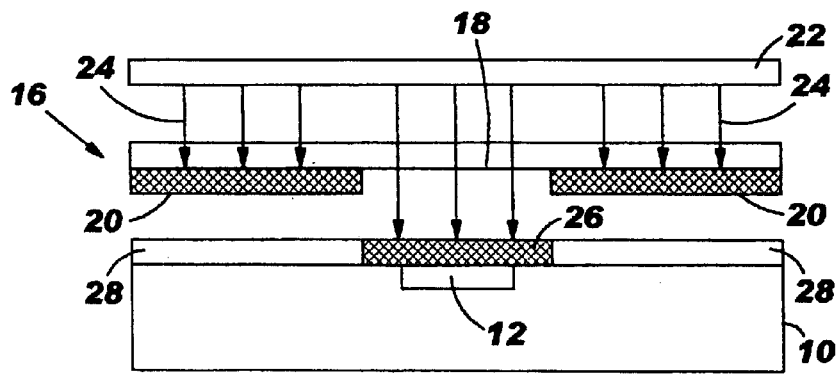
FIG. 2B is a diagrammatic cross-section view in accordance with the teachings of the present invention of a first exposure and photomasking step in a processing step subsequent to FIG. 2A.
Figure 2C:
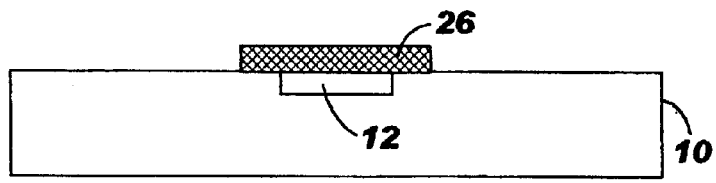
FIG. 2C is a diagrammatic cross-section view in accordance with the teachings of the present invention of a first development step in a processing step subsequent to FIG. 2B.

In FIG. 2C, the first negative photoresist layer is developed with a suitable solvent to remove the non-exposed regions 28 (FIG. 2B) of the first negative photoresist material and what remains is the area 26 having had exposure to the rays of the energy source. Preferred solvents for this removal or stripping step include, but are not limited to, organic solvents, such as butylcellosolve acetate or other. Preferred processing conditions include combinations of spraying under pressure and stationary puddling of the developing solvent. In alternative embodiments, the removal process may simply include vaporizing the non-exposed region 28 during the UV exposure step.

Figure 2D:
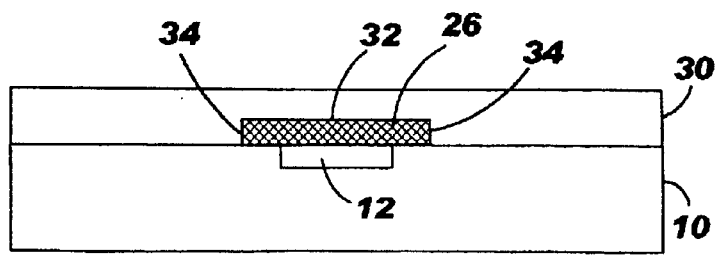
FIG. 2D is a diagrammatic cross-section view in accordance with the teachings of the present invention of an inkjet printhead wafer with a second negative photoresist layer in a processing step subsequent to FIG. 2C.

In FIG. 2D, a second negative photoresist layer 30 becomes formed on both the surface of the substrate 10 and on a surface 32 and sidewalls 34 of the area 26 of the first negative photoresist layer. Preferably, but not required, the second negative photoresist layer 30 is formed to a substantially uniform thickness or depth by spin casting a solution or laminating a dry film of the second negative photoresist material to a thickness approximately double the thickness of the first negative photoresist layer. In one embodiment, this depth equals about 28–32 microns. Again, the depth depends upon user application.

Figure 2E:
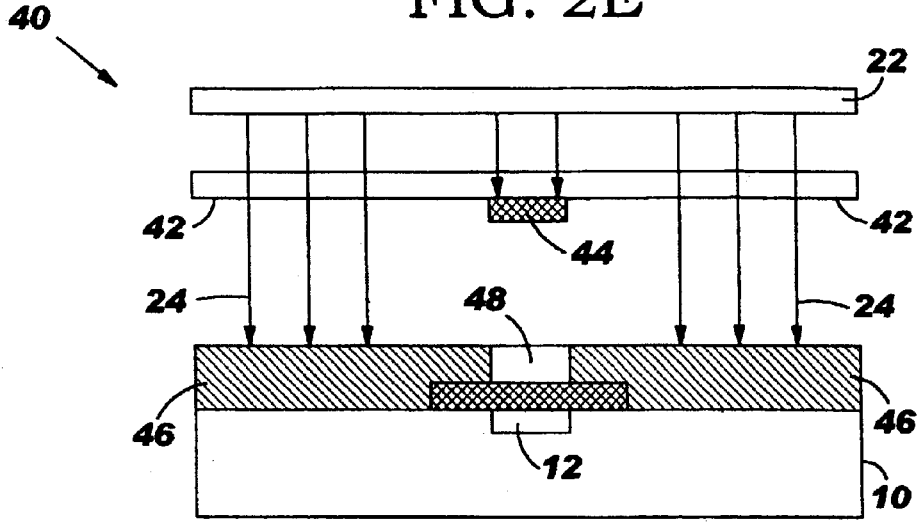
FIG. 2E is a diagrammatic cross-section view in accordance with the teachings of the present invention of a second exposure and photomasking step in a processing step subsequent to FIG. 2D.

In FIG. 2E, a second photomask 40 having light passing 42 and non-light passing regions 44 becomes inserted between the energy source 22 and the substrate to expose portion(s) of the second negative photoresist layer in accordance with the pattern of the second photomask. In a preferred embodiment, the photomask is configured such that a region 46 other than above the ink ejection element 12 is exposed to energy rays 24 from the energy source. In this manner, similar to the first negative photoresist layer, the second negative photoresist layer becomes cross-linked and hardened in a desired pattern.

Figure 2F:
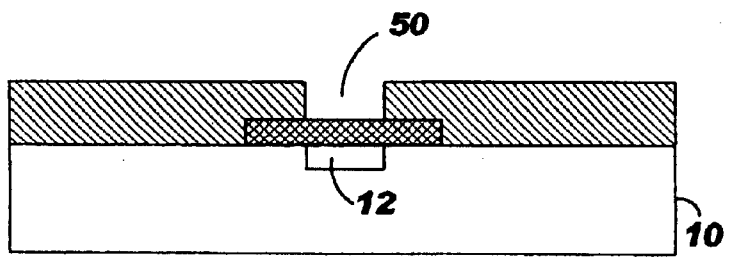
FIG. 2F is a diagrammatic cross-section view in accordance with the teachings of the present invention of a second development step in a processing step subsequent to FIG. 2E.

In FIG. 2F, application of a suitable solvent develops the substrate by removing or stripping the non-exposed second negative photoresist layer portion 48 (FIG. 2E) and what remains is a nozzle orifice 50 above the ink ejection element 12. Skilled artisans will appreciate that the photomasks taught herein will have fiducials corresponding exactly to the fiducials of the photomasks used to fabricate the ink ejection element 15 during previous processing steps such that the nozzle orifice 50 will have desirable and accurate alignment therewith.

In accordance with this invention, the compositions of the first and second negative photoresist layers 14, 30 are selected such that the first layer has a temperature of degradation lower than the temperature of degradation for the second layer. As before, until examples of the first negative photoresist layer include, but are not limited to, epoxy photoresists and have temperatures of degradation occurring at about 200 to 250 degrees Celsius. Whereas, examples of the second negative photoresist include, but are not limited to, photoimageable polyimides available under the trademark Durimide® from Arch Chemicals and photosensitive polyimides from HD Microsystems and have temperatures of degradation of at least 300 degrees Celsius and higher.

Figure 2G:
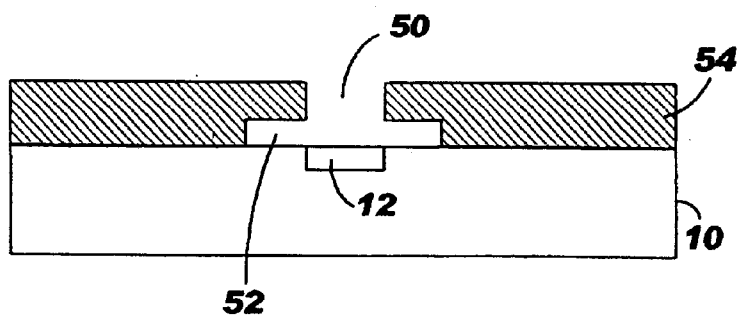
FIG. 2G is a diagrammatic cross-section view in accordance with the teachings of the present invention of an inkjet printhead wafer and nozzle plate in a processing step subsequent to FIG. 2F.

In this manner, the structure of FIG. 2F can undergo heating or baking at a temperature greater than or substantially equal to the degradation temperature of the first negative photoresist layer and lower than the degradation temperature of the second negative photoresist layer which, in sequence, causes degradation of the first layer, but not the second, so that it can be removed and the nozzle plate formed as seen in FIG. 2G. In a preferred embodiment, the nozzle plate 54 has a nozzle orifice 50 and a bubble chamber or other ink flow feature 52 substantially aligned over the ink ejection element 12. It should be appreciated that the finished nozzle plate may have any variety of shapes and cross-sections and should not be limited to that shown. Even further, the invention may include more than two negative photoresist layers and/or layers other than negative photoresists. In further embodiments, skilled artisans will appreciate that the photomasks 16, 40 may be altered such that light passing and non-light passing regions may be reversed and the negative photoresists replaced with positive photoresists.

As further contemplated, the heating of the first and second negative photoresist layers may be undertaken at a substantially constant temperature, throughout a cycle or range of temperatures or at selected temperatures and all embodiments are embraced herein.

The foregoing description is presented for purposes of illustration and description of the various aspects of the invention. The descriptions are not intended to be exhaustive or to limit the invention to the precise form disclosed. The embodiments described above were chosen to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed:

1. A method of forming a nozzle plate for a substrate with an ink ejection element, comprising:

forming a first and second negative photoresist layer on said substrate, said first negative photoresist layer having a first degradation temperature and said second negative photoresist layer having a second degradation temperature; and heating said first and second negative photoresist layers at a temperature at least as high as said first degradation temperature and lower than said second degradation temperature.

2. The method of claim 1, further including exposing a portion of said first negative photoresist layer in an area adjacent said ink ejection element.

3. The method of claim 1, further including exposing a portion of said second negative photoresist layer in a region other than above said ink ejection element.

4. The method of claim 1, further including removing said first negative photoresist layer to form said nozzle plate, said removing including developing with a solvent.

5. The method of claim 1, wherein said heating further includes heating in a range of temperatures between about 200 and 300 degrees Celsius.

6. The method of claim 1, wherein said forming further includes one of spin casting a solution and laminating a dry film.

7. A method of forming a nozzle plate, comprising:

providing a substrate with an ink ejection element;

forming a first negative photoresist layer on said substrate, said first negative photoresist layer having a first degradation temperature;

exposing said first negative photoresist layer;

removing a portion of said first negative photoresist layer thereby leaving a remainder of said first negative photoresist layer;

forming a second negative photoresist layer on said substrate, said second negative photoresist layer having a second degradation temperature higher than said first degradation temperature;

exposing said second negative photoresist layer;

removing a portion of said second negative photoresist layer thereby leaving a remainder of said second negative photoresist layer that defines a nozzle orifice;

heating said remainders of said first and second negative photoresist layers at a temperature higher than or substantially equal to said first degradation temperature; and removing said remainder of said first negative photoresist layer to form said nozzle plate.

8. The method of claim 7, wherein said exposing said first negative photoresist layer further includes exposing in an area adjacent said ink ejection element.

9. The method of claim 7, wherein said exposing said second negative photoresist layer further includes exposing a region other than above said ink ejection element.

10. A method of forming a nozzle plate, comprising:

providing a substrate with an ink ejection element;

forming a first negative photoresist layer on said substrate, said first photoresist layer having a first degradation temperature;

exposing said first negative photoresist layer in an area adjacent said ink ejection element;

removing said first negative photoresist layer in other than said area;

forming a second negative photoresist layer on both said substrate and a surface of said area, said second negative photoresist layer having a second degradation temperature higher than said first degradation temperature;

exposing said second negative photoresist layer in a region other than above said ink ejection element;

removing said second negative photoresist layer in other than said region to form a nozzle orifice;

heating said first and second negative photoresist layers at a temperature higher than or substantially equal to said first degradation temperature and lower than said second degradation temperature to degrade said first negative photoresist layer; and removing said first negative photoresist layer to form one of an ink flow feature and a bubble chamber above said ink ejection element and below said nozzle orifice.

11. The method of claim 10, wherein said forming further includes one of spin casting a solution and laminating a dry film.

12. The method of claim 10, wherein said exposing further includes exposing with an ultraviolet source.

13. A method of forming a nozzle plate for a substrate with an ink ejection element, comprising:

forming a first negative photoresist layer on said substrate, said first negative photoresist layer having a first degradation temperature;

forming a second negative photoresist layer on said substrate and said first negative photoresist layer, said second negative photoresist layer having a second degradation temperature higher than said first degradation temperature;

heating said first and second negative photoresist layers at a temperature higher than or substantially equal to said first degradation temperature; and removing said first negative photoresist layer to form said nozzle plate on said substrate including a bubble chamber and a nozzle orifice above said ink ejection element.

14. The method of claim 13, wherein said heating further includes heating at a plurality of temperatures.

15. The method of claim 14, wherein said heating further includes heating in a range of temperatures between about 200 and 300 degrees Celsius.

16. The method of claim 13, further including exposing a portion of said first negative photoresist layer in an area adjacent said ink ejection element.

17. The method of claim 13, further including exposing a portion of said second negative photoresist layer in a region other than above said ink ejection element.

18. The method of claim 13, wherein said removing further includes developing with an organic solvent.

19. The method of claim 13, wherein said forming further includes one of spin casting a solution and laminating a dry film on a surface of said substrate.

20. The method of claim 13, wherein said removing further includes removing said first negative photoresist layer from underneath a portion of said second negative photoresist layer.

* * * * *